(12) United States Patent
Ishii et al.

(10) Patent No.: US 10,608,405 B2
(45) Date of Patent: Mar. 31, 2020

(54) SOLID-STATE LASER DEVICE

(71) Applicant: FUJIFILM Corporation, Tokyo (JP)

(72) Inventors: Hiroyasu Ishii, Kanagawa (JP); Dai Murakoshi, Kanagawa (JP); Takatsugu Wada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/200,130

(22) Filed: Nov. 26, 2018

(65) Prior Publication Data

US 2019/0097386 A1     Mar. 28, 2019

Related U.S. Application Data

(63) Continuation of application No. PCT/JP2017/019804, filed on May 26, 2017.

(30) Foreign Application Priority Data

May 27, 2016   (JP) ................................ 2016-105870

(51) Int. Cl.
    *H01S 5/022*        (2006.01)
    *H01S 3/02*         (2006.01)
    (Continued)

(52) U.S. Cl.
    CPC ............ *H01S 5/02236* (2013.01); *H01S 3/02* (2013.01); *H01S 3/025* (2013.01); *H01S 3/042* (2013.01);
    (Continued)

(58) Field of Classification Search
    CPC .... H01S 5/02236; H01S 3/0615; H01S 3/061; H01S 3/11; H01S 3/08054; H01S 3/0805;
    (Continued)

(56) References Cited

U.S. PATENT DOCUMENTS 4,644,555 A      2/1987   Amano
4,858,243 A *   8/1989   Bar-Joseph ............. H01S 3/042
                                                                     372/72

(Continued)

FOREIGN PATENT DOCUMENTS

EP         3125377 A1     2/2017
JP         57-66682 A     4/1982

(Continued)

OTHER PUBLICATIONS

Extended European Search Report for corresponding European Application No. 17802942.7, dated Apr. 18, 2019.

(Continued)

*Primary Examiner* — Xinning(Tom) Niu
(74) *Attorney, Agent, or Firm* — Birch, Stewart, Kolasch & Birch, LLP

(57) ABSTRACT

A solid-state laser device includes a resonator composed of a pair of mirrors, a laser rod disposed in the resonator, and a laser chamber. The resonator and the laser rod are disposed in a housing. The laser rod is inserted through a hole of the laser chamber and is supported in a state in which two end portions are exposed. An O-ring is disposed at an exposed root of at least one rod end portion exposed from the laser chamber. The solid-state laser device includes a cover member that is disposed on a rod side surface of the rod end portion between the O-ring and a rod end surface and that blocks incidence of stray light, which is generated in the housing, on the O-ring.

10 Claims, 3 Drawing Sheets

(51) Int. Cl.
*H01S 3/06* (2006.01)
*H01S 3/08* (2006.01)
*H01S 3/11* (2006.01)
*H01S 3/042* (2006.01)
*H01S 5/024* (2006.01)

(52) U.S. Cl.
CPC ............... *H01S 3/06* (2013.01); *H01S 3/061* (2013.01); *H01S 3/0615* (2013.01); *H01S 3/0805* (2013.01); *H01S 3/08054* (2013.01); *H01S 3/11* (2013.01); *H01S 5/02208* (2013.01); *H01S 5/02469* (2013.01)

(58) Field of Classification Search
CPC .. H01S 3/025; H01S 5/02469; H01S 5/02208; H01S 3/042; H01S 3/02; H01S 3/06
See application file for complete search history.

(56) References Cited

U.S. PATENT DOCUMENTS

| | | | |
|---|---|---|---|
| 5,805,625 | A | 9/1998 | Langner et al. |
| 2003/0095581 | A1 | 5/2003 | Edwards |
| 2004/0240496 | A1 | 12/2004 | Fujikawa et al. |
| 2005/0169152 | A1* | 8/2005 | Miyake ............... G11B 7/1353 369/112.15 |
| 2006/0238958 | A1* | 10/2006 | Nakamura ............. H01G 9/155 361/502 |
| 2014/0055766 | A1* | 2/2014 | Mochizuki ............ G03F 7/7015 355/67 |
| 2015/0309437 | A1* | 10/2015 | Otsuka ................. G03G 15/043 347/118 |
| 2017/0201058 | A1 | 7/2017 | Murakoshi |

FOREIGN PATENT DOCUMENTS

| | | |
|---|---|---|
| JP | 61-82488 A | 4/1986 |
| JP | 3-34588 A | 2/1991 |
| JP | 5-218530 A | 8/1993 |
| JP | 2000-91670 A | 3/2000 |
| JP | 2003-198011 A | 7/2003 |
| JP | 2004-241488 A | 8/2004 |
| JP | 2004-363296 A | 12/2004 |
| JP | 2009-117881 A | 5/2009 |
| JP | 2011-18815 A | 1/2011 |
| JP | 2015-192044 A | 11/2015 |
| WO | WO 03/069738 A1 | 8/2003 |
| WO | WO 2016/051664 A1 | 4/2016 |

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2017/019804, dated Dec. 6, 2018, with English translation.
International Search Report (form PCT/ISA/210) for International Application No. PCT/2017/019804 dated Jul. 25, 2017, with English Translation.
Japanese Office Action dated Aug. 27, 2019, for corresponding Japanese Patent Application No. 2018-519651, with English translation.

* cited by examiner

SOLID-STATE LASER DEVICE

CROSS-REFERENCE TO RELATED APPLICATIONS

This application is a continuation application of International Application No. PCT/JP2017/019804, filed May 26, 2017, the disclosure of which is incorporated herein by reference in its entirety. Further, this application claims priority from Japanese Patent Application No. 2016-105870, filed May 27, 2016, the disclosure of which is incorporated herein by reference in its entirety.

BACKGROUND OF THE INVENTION

1. Field of the Invention

The present invention relates to a solid-state laser device, and, in particular, to a solid-state laser device in which a laser rod, which is a solid-state laser medium, is contained in a laser chamber.

2. Description of the Related Art

For example, a solid-state laser device is composed of a resonator; a rod-shaped solid-state laser medium (laser rod) disposed in the resonator; an excitation light source, such as a flash lamp, for exciting the laser rod; and optical members, such as a Q switch. In many cases, in order to efficiently irradiate the laser rod with excitation light emitted from the excitation light source, the laser rod and the excitation light source are contained in a laser chamber in such a way that at least parts thereof are enclosed in the laser chamber.

In general, in an optical system, generation of a light beam or the like due to unintended reflection (stray light) cannot be avoided. However, stray light causes various problems, such as an error signal, damage to an element, and the like, in an optical system used. In order to reduce problems that occur in an optical system due to stray light, it is necessary to take measures appropriate for the optical system, and a solid-state laser device is no exception.

JP2009-117881A discloses a structure that includes an aperture that performs opening limitation for the purpose of preventing a holder near a laser rod from being heated by stray light. JP2000-91670A discloses a structure that includes an aperture that performs opening limitation for the purpose of preventing heating of peripheral components by stray light and decrease in quality of a main beam.

SUMMARY OF THE INVENTION

Regarding a solid-state laser device, a small short-pulse laser device is in demand. If short-pulse laser oscillation is to be realized in a small device, the energy density in a resonator increases. With such a high-energy-density laser device, when an object outside of a laser light path is irradiated with stray light that is generated inside or outside the resonator, dust or outgas is generated from a member that is near a laser rod and that may generate dust or outgas. If dust or outgas adheres to the laser rod or an optical element near the laser rod, energy of laser light concentrates on the adhering portion and burn the adhering portion, and thereby the laser rod or the like may become damaged.

On the background described above, it is an object of the present invention to provide a solid-state laser device that can suppress damage to a laser rod and that can be stably driven for a long period.

A solid-state laser device includes a resonator composed of a pair of mirrors, a laser rod disposed in the resonator, and a laser chamber that contains at least a part of the laser rod. The resonator and the laser rod are disposed in a housing. The laser chamber includes a hole having a columnar shape that is shorter than a longitudinal axial length of the laser rod. The laser rod is inserted through the hole of the laser chamber and is supported in a state in which two end portions of the laser rod are exposed from the hole. An O-ring is disposed at an exposed root of at least one end portion of the two end portions, the exposed root being exposed from the laser chamber. The solid-state laser device includes a cover member that is disposed on a side surface of the laser rod between the O-ring and an end surface of the at least one end portion of the laser rod and that blocks incidence of stray light, which is generated in the housing, on the O-ring.

In the solid-state laser device according to the present invention, preferably, the cover member is made of at least one of a ceramic, glass, or a fluororesin.

Preferably, the solid-state laser device according to the present invention includes an aperture member that is disposed in a light path of the resonator, that suppresses propagation of stray light, which is generated in the housing, in a direction from one of the pair of mirrors toward the laser rod, and that has an opening in the light path.

In the solid-state laser device according to the present invention, preferably, a diameter of the opening of the aperture member is larger than a diameter of the laser rod.

In the solid-state laser device according to the present invention, preferably, the O-ring is made of a fluororesin.

Preferably, the solid-state laser device according to the present invention further includes an O-ring pressing plate between the cover member and the O-ring; and the O-ring pressing plate is made of at least one of a ceramic, glass, or a fluororesin.

In the solid-state laser device according to the present invention, preferably, the laser rod is made of an alexandrite crystal.

In the solid-state laser device according to the present invention, preferably, a diameter of the laser rod is 3 mm or smaller.

In the solid-state laser device according to the present invention, the laser chamber includes a hole having a columnar shape that is shorter than a longitudinal axial length of the laser rod; the laser rod is inserted through the hole of the laser chamber and is supported in a state in which two end portions of the laser rod are exposed; an O-ring is disposed at an exposed root of at least one end portion of the two end portions, the exposed root being exposed from the laser chamber; and the solid-state laser device includes a cover member that is disposed on a side surface of the laser rod between the O-ring and an end surface of the at least one end portion of the laser rod and that blocks incidence of stray light, which is generated in the housing, on the O-ring. With this structure, the solid-state laser device according to the present invention can effectively prevent damage to the laser rod by suppressing incidence of stray light on the O-ring and suppressing generation of dust and outgas. Moreover, by suppressing damage to the laser rod, the solid-state laser device can be driven stably for a long period.

DESCRIPTION OF THE PREFERRED EMBODIMENTS

Figure 1:
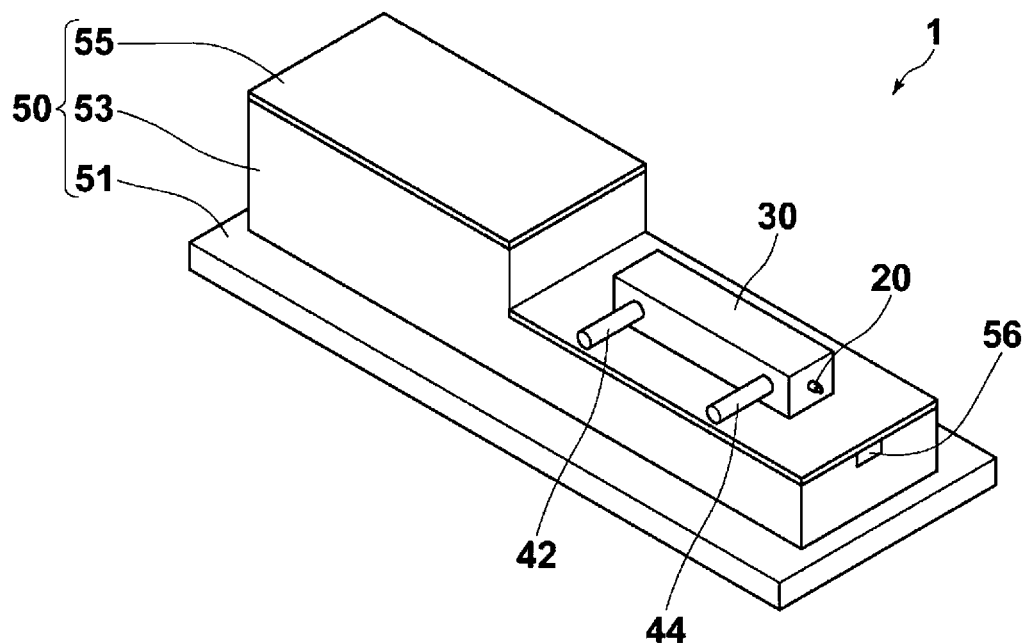
FIG. 1 is a schematic perspective view of a solid-state laser device according to an embodiment.
Figure 2:
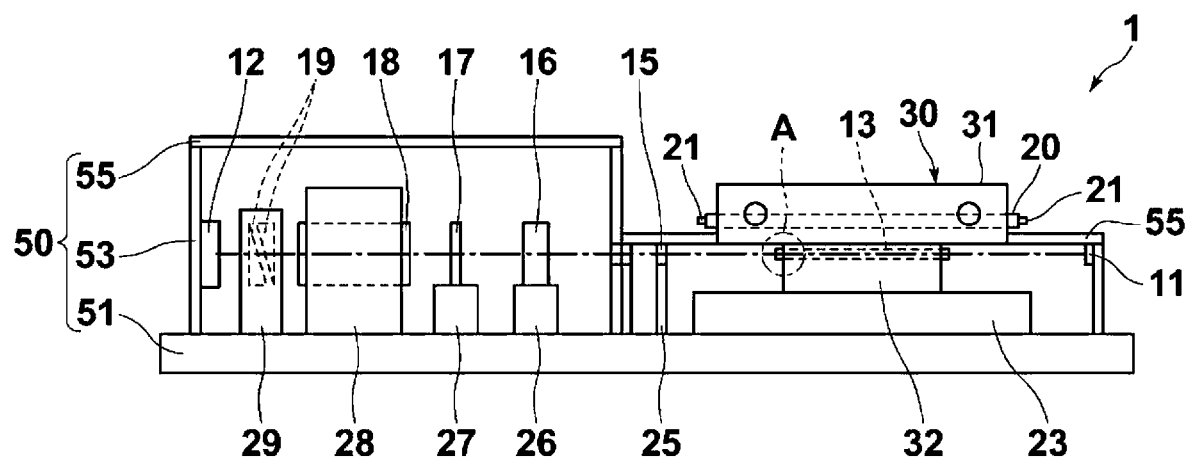
FIG. 2 is a schematic side view of the solid-state laser device according to the embodiment.
Figure 3:
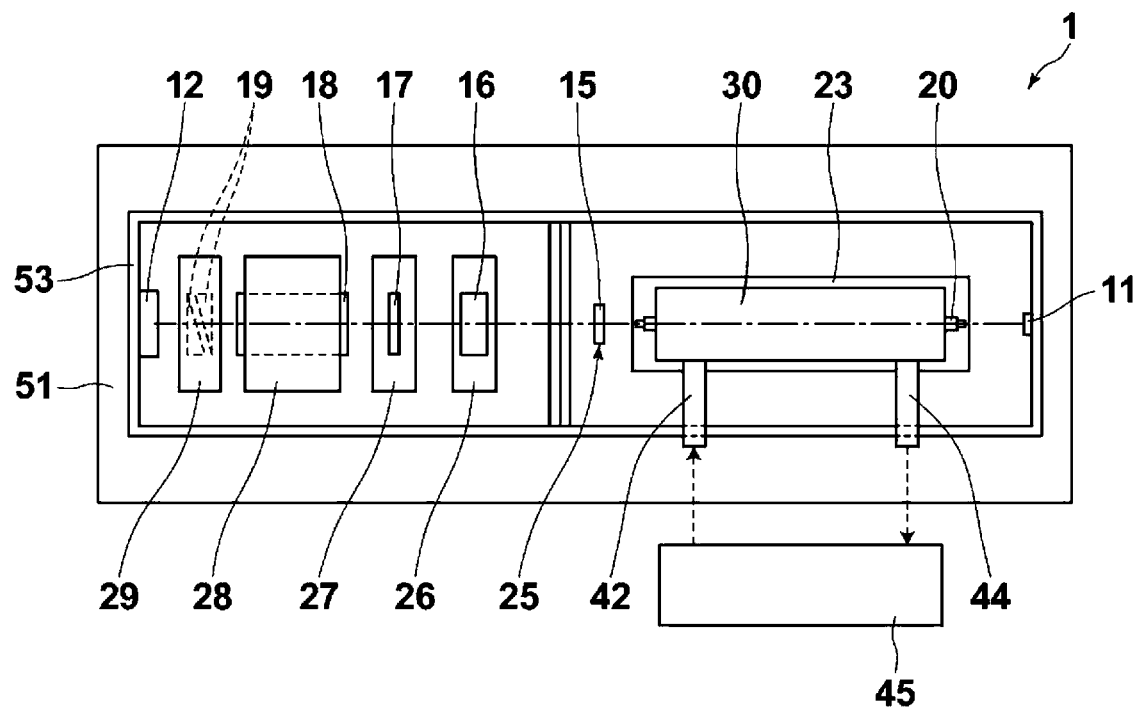
FIG. 3 is a schematic plan view of the solid-state laser device according to the embodiment.

Hereinafter, embodiments of the present invention will be described with reference to the drawings. FIG. 1 is a schematic perspective view of a solid-state laser device according to an embodiment of the present invention. FIGS. 2 and 3 are respectively a schematic side view and a schematic plan view of the solid-state laser device according to the present embodiment, in each of which a part of a housing is omitted and the arrangement of elements in the housing is schematically shown.

A solid-state laser device 1 includes a pair of mirrors 11 and 12 that constitute a resonator, a laser rod 13 that is disposed in the resonator, and a laser chamber 30 that contains at least a part of the laser rod 13. The solid-state laser device 1 further includes optical members between the mirror 12 and the laser rod 13. The optical members are an aperture member 15, a polarizer 16, a shutter 17, a Q switch 18, and a wedge prism pair 19. The mirrors 11 and 12, the laser rod 13, and the optical members 15 to 19 are disposed in a housing 50. A part of the laser chamber 30 is exposed from the housing 50 to the outside, and a flash lamp 20 is contained in the part of the laser chamber 30 exposed from the housing 50. The housing 50 is composed of a base 51, a side wall portion 53, and a lid portion 55, and includes an emission opening 56, for outputting laser light, in a part of the side wall portion 53.

The pair of mirrors 11 and 12 are disposed so as to face each other with the laser rod 13 therebetween and constitute a linear resonator. The mirror 11 is a partially transmissive mirror and functions as a so-called output mirror that outputs laser light. The mirror 12 is a high reflection mirror and functions as a so-called rear mirror. In the present embodiment, the mirror 11 is a planar mirror, and the mirror 12 is a concave mirror. Hereinafter, the mirrors 11 and 12 may be respectively referred to as an output mirror 11 and a rear mirror 12. In the present embodiment, the output mirror 11 and the rear mirror 12 face each other and are attached to side surfaces, in the transversal direction, of the side wall portion 53 of the housing 50.

In the solid-state laser device 1 according to the present embodiment, a linear optical resonator is constituted by the mirrors 11 and 12. However, instead of a linear resonator, a solid-state laser device according to the present invention may include, for example, an L-shaped, Z-shaped, or an X-shaped resonator structure that includes prisms and mirrors, for changing the direction of light, in the light path. On the other hand, in view of reduction in size and cost, the number of optical members is preferably smaller, and a linear resonator is most preferable.

The laser rod 13, which is a solid-state laser medium, is made by forming a solid-state laser crystal, such as alexandrite ($Cr:BeAl_2O_4$), neodymium YAG (Nd:YAG (yttrium aluminum garnet)), titanium-sapphire ($Ti:Al_2O_3$), into a rod shape. The term "rod shape" refers to an elongated cylindrical shape such that the distance between two discs, which are end surfaces, is larger than the diameter of the discs. A solid-state laser medium is not limited to the one described above, and another known laser medium may be used, as appropriate. Preferably, the laser rod 13 has a small diameter in order to reduce the size of the entire device. For example, preferably, the diameter of a (circular) cross section of the laser rod 13 perpendicular to the longitudinal direction (hereinafter, referred to as "the rod diameter") is 4 mm or smaller. More preferably, the diameter is 3 mm or smaller, and further preferably, 2.5 mm or smaller. The length of the laser rod is preferably 75 mm or smaller, and more preferably, 60 mm or smaller.

The flash lamp 20 is an excitation light source that emits excitation light for exciting the laser rod 13. The entirety of the flash lamp 20, including terminals 21 at both ends thereof, is substantially bar-shaped. The length of the flash lamp 20 is, for example, about 10 cm. The length of the flash lamp 20 is defined as the length of the flash lamp 20 including the terminals 21 in the longitudinal direction. Lead wires (not shown) are connected to the two terminals 21, and the flash lamp 20 is connected to a lighting power source via the lead wires. To be more specific, for example, a xenon flash lamp or the like can be used as the flash lamp 20. An excitation light source of a solid-state laser device according to the present invention is not limited to the flash lamp 20. For example, a light source in which a plurality of LEDs (light-emitting diodes) are arranged in a transparent linear tube and that has a bar-like shape as a whole may be used.

The laser chamber 30 is made of, for example, a metal, and is configured to contain the laser rod 13 and the flash lamp 20. The laser chamber 30 has an inner space for containing the laser rod 13 and the flash lamp 20, and transmits light that is emitted from the flash lamp 20 in the inner space to the laser rod 13. For example, a reflection surface is formed inside the laser chamber 30, and the laser rod 13 is directly irradiated with light emitted from the flash lamp 20 or is irradiated with light emitted from the flash lamp 20 and reflected by the reflection surface.

Pipes 42 and 44 are connected to a side wall of the laser chamber 30. As schematically illustrated in FIG. 3, the laser chamber 30 is connected to a cooling device 45 via the pipes 42 and 44. The cooling device 45 is a device for cooling the laser rod 13 and the flash lamp 20. The cooling device 45 supplies a coolant, such as pure water, into the laser chamber 30 via the pipe 42. The cooling device 45 receives coolant drained from the laser chamber 30 through the pipe 44, reduces the temperature of the coolant, and supplies the coolant into the laser chamber 30 again. By circulating the coolant in this way, the temperature of the laser rod 13 in the laser chamber 30 can be maintained in a desirable temperature range.

Figure 4:
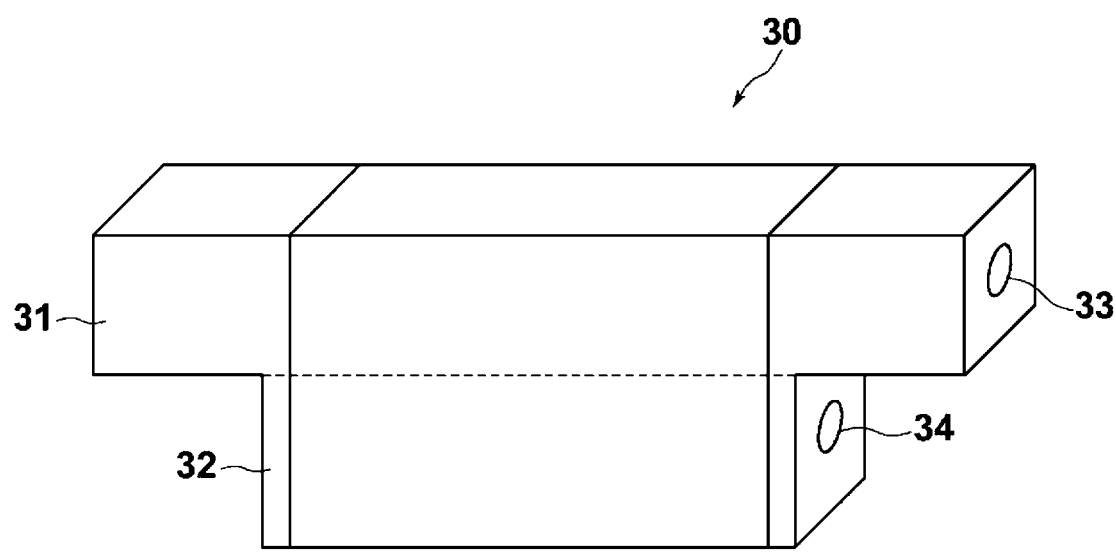
FIG. 4 is a perspective view of a laser chamber.

FIG. 4 is an external perspective view of the laser chamber 30. In FIG. 4, holes and the like for connecting the pipes 42 and 44 (see FIG. 1) are omitted. The laser chamber 30 has a first portion 31 for containing the flash lamp 20 and a second portion 32 for containing the laser rod 13. The first portion 31 includes, as a space for containing the flash lamp 20, a hole 33 that extends therethrough from one of wall surfaces perpendicular to the longitudinal direction to the other of the wall surfaces. The second portion 32 includes, as a space for containing the laser rod 13, a hole 34 that extends therethrough from one of wall surfaces perpendicular to the longitudinal direction to the other of the wall surfaces. That is, the two holes 33 and 34 extend parallel to each other in the longitudinal direction of the laser chamber 30.

The hole 34 of the laser chamber 30 has a cylindrical shape that is shorter than the longitudinal axial length of the laser rod 13. The laser rod 13 is inserted into the hole 34 and supported in a state in which both end portions thereof are exposed from the hole 34. The flash lamp 20 is supported by being inserted through the hole 33 (see FIG. 2). The inside of the laser chamber 30 is a flow passage of a coolant, and portions of the laser chamber 30 through which the laser rod 13 and the flash lamp 20 extend are appropriately sealed with O-rings or the like. As long as the hole 34 can accommodate the laser rod 13, the shape of the hole 34 is not limited to a cylindrical shape, and may be a prismatic shape, an elliptical-cylindrical shape, or the like. The flash lamp 20 can be inserted into or extracted from the laser chamber 30 in the longitudinal direction on the right side in the figures. In the present embodiment, the length of the first portion 31 of the laser chamber 30 in the longitudinal direction is larger than the length of the second portion 32 in the longitudinal direction. However, the lengths of the first portion 31 and the second portion 32 in the longitudinal direction may be the same as each other.

As illustrated in FIG. 2, the laser chamber 30 is supported by a support base 23 in such a way that the first portion 31, which contains the flash lamp 20, protrudes from the lid portion 55 of the housing 50 to the outside, and the second portion 32, which contains the laser rod 13, is disposed in the housing 50. The flash lamp 20 can be replaced in a state in which the lid portion 55 is closed.

Figure 5:
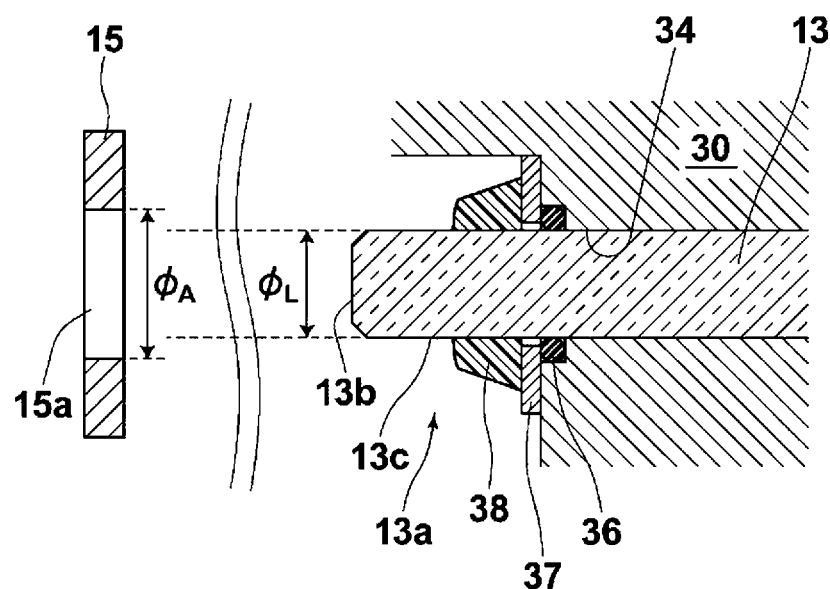
FIG. 5 is an enlarged sectional view of a region near an end portion of a laser rod exposed from the laser chamber.

FIG. 5 is an enlarged sectional view of a region near one end portion of the laser rod 13 exposed from the laser chamber 30 (a region A surrounded by a broken line in FIG. 2). In FIG. 5, a cross section of the aperture member 15 is also shown.

As illustrated in FIG. 5, an O-ring 36 is disposed at an exposed root of an end portion 13a of the laser rod 13 (hereinafter, referred to as "a rod end portion 13a") exposed from the laser chamber 30. Moreover, an O-ring pressing plate 37 that has a through-hole, which allows the laser rod 13 to extend therethrough, is disposed adjacent to the O-ring 36 and between the O-ring 36 and an end surface 13b of the laser rod 13 (hereinafter, referred to as "the rod end surface 13b"). The phrase "the exposed root of the end portion 13a exposed from the laser chamber 30" refers to a part of the rod end portion 13a that is exposed from the laser chamber 30 (that is, the hole 34) and that is most adjacent to the laser chamber 30. The O-ring 36 is fitted onto the laser rod 13 and is disposed in an O-ring receiving portion formed at an end portion of the hole 34 of the laser chamber 30. By fixing the O-ring pressing plate 37 onto the laser chamber 30 with screws, the O-ring 36 is urged toward the laser chamber 30, the flow path of the coolant is sealed, and the laser rod 13 is fixed. The solid-state laser device includes a cover member 38 that is disposed on a side surface 13c (hereinafter referred to as "the rod side surface 13c) of the laser rod between the rod end surface 13b and the O-ring 36, which is fitted onto the rod end portion 13a. The cover member 38 blocks incidence of stray light, which is generated in the housing 50, on the O-ring 36. That is, the O-ring pressing plate 37 is disposed between the cover member 38 and the O-ring 36.

The O-ring 36, the O-ring pressing plate 37, and the cover member 38 are preferably disposed at each of two end portions exposed from the laser chamber 30, but may be disposed at at least one end portion. When the cover member 38 has a function equivalent to that of the O-ring pressing plate 37, the O-ring pressing plate 37 may be omitted.

In a solid-state laser device, a laser rod, which is a solid-state laser medium, is the light path itself, and it can be said that a member that is in contact with the laser rod is substantially in contact with the light path. As illustrated in FIG. 5, the O-ring 36 is present at a position extremely close to the rod end surface 13b, and, if dust or gas is generated from the O-ring 36, the dust or gas tends to adhere to the rod end surface 13b. If the dust or the gas, which has adhered to the rod end surface 13b, is irradiated with laser light, the dust or the gas may be burned and may damage the laser rod 13. The solid-state laser device 1 according to the present embodiment, which includes the cover member 38, can prevent incidence of stray light on the O-ring 36, and thereby effectively suppress generation of dust or outgas.

It is necessary that the cover member 38 generate only small amounts of dust and outgas, absorb only a small amount of laser light, and have heat resistance. Preferably, the cover member 38 can diffuse laser light. Accordingly, the cover member 38 is preferably made of at least one of a ceramic, ground glass, or a fluororesin such as polytetrafluoroethylene (polytetrafluoroethylene; PTFE). In order to prevent incidence of stray light on the O-ring 36, a soft material that can closely contact the laser rod 13 is preferable. Accordingly, a fibrous ceramic or glass, an unbaked fluororesin, or the like is particularly suitable.

Figure 6:
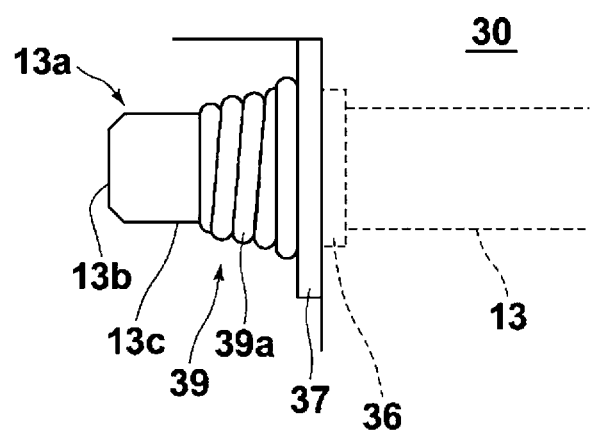
FIG. 6 is an enlarged view of a region near an end portion of a laser rod including a cover member according to a design modification.

FIG. 6 is an enlarged view of a region near an end portion of a laser rod including a cover member 39 according to a design modification. The cover member 39 illustrated in FIG. 6 is formed by winding a tape 39a, which is made of PTFE, multiple times around the rod side surface 13c. The cover member 39 formed by winding the tape 39a multiple times is preferable, because the cover member 39 can closely adhere to the laser rod 13 and the size thereof can be freely changed in accordance with the number of turns. By winding the tape 39a to such a degree that the O-ring 36 cannot be seen when viewed from the rod end surface 13b side, incidence of stray light on the O-ring 36 can be effectively suppressed.

In FIG. 6, if it is possible to sufficiently urge the O-ring 36 with the cover member 39 and to fix the laser rod 13, the O-ring pressing plate may be omitted.

As the O-ring 36, a general O-ring made of a rubber, which is not a fluorocarbon rubber, may be used. However, preferably, the O-ring 36 is made of a material that generates only small amounts of dust and outgas, such as a fluorocarbon rubber.

Stray light may be incident on the O-ring pressing plate 37 and dust and outgas may be generated. Therefore, preferably, the O-ring pressing plate 37 is also made of a material that generates only small amounts of dust and outgas, such as a ceramic or a fluororesin. Also preferably, the size of the cover member may be increased to suppress incidence of stray light on the O-ring pressing plate.

As described above, the solid-state laser device 1 includes optical members on the rear mirror 12 side of the laser rod 13. The optical members are the aperture member 15, the polarizer 16, the shutter 17, the Q switch 18, and the wedge prism pair 19. The aperture member 15 is disposed most adjacent to the laser rod 13. Due to such disposition, the aperture member 15 can suppress propagation of stray light generated in the housing 50, mainly stray light that is generated by the polarizer 16, the shutter 17, the Q switch 18, the wedge prism pair 19, the rear mirror 12, or the like, toward the laser rod 13. The aperture member 15, which has an opening 15a in the light path, can block stray light that propagates from the optical members 16 to 19 toward the laser rod 13 with a comparatively large angle and that considerably deviates from the light path. As in the present embodiment, by disposing the aperture member 15 between the laser chamber 30 and the other optical members 16 to 19, the aperture member 15 can prevent the stray light from being incident on the laser chamber 30.

Preferably, the opening diameter $\phi_A$ of the aperture member 15 is larger than or equal to the rod diameter $\phi_L$. More preferably, as illustrated in FIG. 5, the opening diameter $\phi_A$ is larger than the rod diameter $\phi_L$. In particular, when a small-diameter laser rod having a rod diameter $\phi_L$ of 4 mm or smaller is used as the laser rod 13 for the purpose of reduction in size of the device and reduction in pulse width of laser light, opening limitation by the aperture member 15 considerably affects the laser output power. That is, because the laser output power is highly sensitive to the positional accuracy of the aperture member 15 for a small-diameter laser rod, if the positional accuracy of the aperture member is low, decrease in stability occurs. On the other hand, increasing the positional accuracy leads to increase in manufacturing cost. Accordingly, when using a small-diameter laser rod, preferably, the opening diameter of the aperture member is larger than the rod diameter. However, because the effect of blocking stray light may not be sufficiently obtained if the opening diameter of the aperture member is too large, preferably, the opening diameter is 120% of the rod diameter or smaller. Preferably, the opening shape of the aperture member 15 is similar to the end surface shape of the laser rod 13.

It is necessary that, as with the cover member 38, the aperture member 15 generate only small amounts of dust and outgas, absorb only a small amount of laser light, and have heat resistance. Preferably, the aperture member 15 is made of a material that can diffuse laser light. Accordingly, a ceramic, ground glass, or a fluororesin such PTFE is suitable as the material of the aperture member 15.

In the present embodiment, the aperture member 15 is disposed only on the rear mirror 12 side of the laser rod 13. Preferably, the aperture member 15 is disposed on each of two sides on which the end surfaces of the laser rod 13 are located, in view of protection by blocking of stray light. However, when disposing the aperture member 15 on each of two sides on which the end surfaces of the laser rod 13 are located, requirement for positional accuracy becomes stricter, and leads to increase in manufacturing cost. This predominantly occurs particularly when the rod has a small diameter. In the present embodiment, by disposing the optical members 16 to 19 only on the rear mirror 12 side of the laser rod 13, main points where stray light is generated are shifted toward one side. Therefore, a sufficiently high protection effect can be obtained even when the aperture member 15 is disposed only on one side.

Next, other elements of the solid-state laser device will be described concisely.

The polarizer 16 selectively outputs a component of oscillated laser light that is linearly polarized in a predetermined direction. The shutter 17, which controls emission of laser light, mechanically blocks emission of laser light by being controlled to be opened or closed. The Q switch 18 performs a so-called Q switch operation so as to generate high-power pulsed laser light. However, a solid-state laser device according to the present invention is not limited to a device that generates pulsed laser light in this way, and may be configured to perform a CW (continuous wave) operation. The wedge prism pair 19 is used to perform optical-system adjustments, such as correction of the optical axis, by adjusting the positions and the angles of the prism pair. With the wedge prism pair 19, it is possible to perform highly-accurate optical axis adjustment.

The optical members 15 to 19 are respectively attached to holders 25 to 29, and the holders 25 to 29 are disposed on the base 51 of the housing 50. Note that the optical members 15 to 19 may be provided as necessary. For example, a solid-state laser device according to the present invention may include, among the optical members, only the Q switch. As necessary, the solid-state laser device may include another optical member.

With the solid-state laser device 1, when the Q switch 18 is switched to a light blocking state and the flash lamp 20 is turned on, the laser rod 13 is excited by excitation light emitted from the flash lamp 20, and a strong population inversion state is formed. Then, when the Q switch 18 is switched to a light transmitting state, light that is emitted from the laser rod 13 by stimulated emission resonates between the minors 11 and 12, the light becomes high-power giant pulse and passes through the output mirror 11, and the light is emitted to the outside of the resonator. The flash lamp 20 and the laser rod 13, which generate heat, are cooled by a coolant that flows through the laser chamber 30.

The solid-state laser device 1, which includes the cover member 38 that suppresses stray light to the O-ring 36 at the exposed root of the laser rod 13 exposed from the laser chamber 30, can suppress damage to the laser rod 13 and can obtain laser output power that is stable for a long period. Moreover, because the solid-state laser device 1 includes the aperture member 15, the solid-state laser device 1 can suppress incidence of stray light into the laser chamber 30 and can further effectively suppress damage to the laser rod 13.

As in the solid-state laser device 1 described above, the aperture member 15 and the cover member 38 or 39 are simultaneously disposed on the same side on which an end surface of the laser rod 13 is located. However, the structure of a solid-state laser device according to the present invention is not limited to a structure in which an aperture member and a cover member are simultaneously disposed on the same side on which the end surface is located. At least a cover member may be disposed on one of the rear side or the output side. In the present embodiment, the optical members 16 to 19 are disposed only on the rear mirror 12 side of the laser rod 13, and main points where stray light is generated are shifted toward one side. Therefore, as combination patterns of the disposition of the aperture member and the cover member, the patterns shown in Table 1 below are considered as the minimum configurations. In Table 1, the terms "Rear Side" and "Output Side" respectively refer to the rear mirror 12 side and the output mirror 11 side of the laser rod 13. In Table 1, the term "present" represents that the aperture member or the cover member is present, and "-" represents that neither the aperture member nor the cover member is present. Combinations in which "-" is changed with "present" in the minimum configurations shown in Table 1 are also preferable.

TABLE 1

| No. | Rear Side | | Output Side | |
| --- | --- | --- | --- | --- |
| | Aperture Member | Cover Member | Aperture Member | Cover Member |
| 1 | present | present | — | — |
| 2 | present | — | — | present |

In view of suppression of incidence of stray light on the laser rod and into the laser chamber, a configuration in which the aperture member and the cover member are disposed at each of two end surfaces of the laser rod is most preferable. On the other hand, as described above, when the aperture member is disposed at each of two end surfaces, it takes time and effort for alignment, and leads to increase in manufacturing cost. The structure of the embodiment described above corresponds to the pattern No. 1 in Table 1. As in the present embodiment, it is preferable that the aperture member and the cover member be simultaneously disposed on the side (in the present embodiment, the rear side) on which a larger number of optical members, such as the Q switch, the shutter, and the like are disposed, because incidence of stray light can be most efficiently suppressed and the manufacturing cost can be reduced.

A solid-state laser device according to the present invention can be used for various purposes, which are not particularly limited. For example, a solid-state laser device according to the present invention can be used as a measurement light source that generates laser light (in particular, pulsed laser light), with which a subject is irradiated for detection of photoacoustic waves, in a photoacoustic measurement device described in JP2012-196430A, JP2014-207971A, or the like.

REFERENCE SIGNS LIST 1 solid-state laser device
11 output mirror
12 rear mirror
13 laser rod
13a rod end portion
13b rod end surface
13c rod side surface
15 aperture member
15a opening of aperture member
16 polarizer
17 shutter
18 Q switch
19 wedge prism pair
20 flash lamp
21 terminal
23 support base
25 to 29 holder
30 laser chamber
31 first portion
32 second portion
33, 34 hole
36 O-ring
37 O-ring pressing plate
38, 39 cover member
39a tape
42, 44 pipe
45 cooling device
50 housing
51 base
53 side wall portion
55 lid portion
56 emission opening

What is claimed is:

1. A solid-state laser device comprising:
a resonator composed of a pair of mirrors;
a laser rod disposed in the resonator; and
a laser chamber that contains at least a part of the laser rod,
wherein the resonator and the laser rod are disposed in a housing,
wherein the laser chamber comprises a hole having a columnar shape that is shorter than a longitudinal axial length of the laser rod,
wherein the laser rod is inserted through the hole of the laser chamber and is supported in a state in which two end portions of the laser rod are exposed from the hole,
wherein an O-ring is disposed at an exposed root of at least one end portion of the two end portions, the exposed root being exposed from the laser chamber, and
wherein the solid-state laser device comprises a cover member that is disposed on a side surface of the laser rod between the O-ring and an end surface of the at least one end portion of the laser rod and that blocks incidence of stray light, which is generated in the housing, on the O-ring.

2. The solid-state laser device according to claim 1, wherein the cover member is made of at least one of a ceramic, glass, or a fluororesin.

3. The solid-state laser device according to claim 1, comprising:
an aperture member that is disposed in a light path of the resonator, that suppresses propagation of stray light, which is generated in the housing, in a direction from one of the pair of mirrors toward the laser rod, and that has an opening in the light path.

4. The solid-state laser device according to claim 2, comprising:
an aperture member that is disposed in a light path of the resonator, that suppresses propagation of stray light, which is generated in the housing, in a direction from one of the pair of mirrors toward the laser rod, and that has an opening in the light path.

5. The solid-state laser device according to claim 3, wherein a diameter of the opening of the aperture member is larger than a diameter of the laser rod.

6. The solid-state laser device according to claim 4, wherein a diameter of the opening of the aperture member is larger than a diameter of the laser rod.

7. The solid-state laser device according to claim 1, wherein the O-ring is made of a fluororesin.

8. The solid-state laser device according to claim 1, further comprising:
an O-ring pressing plate between the cover member and the O-ring,
wherein the O-ring pressing plate is made of at least one of a ceramic, glass, or a fluororesin.

9. The solid-state laser device according to claim 1, wherein the laser rod is made of an alexandrite crystal.

10. The solid-state laser device according to claim 1, wherein a diameter of the laser rod is 3 mm or smaller.

* * * * *